(12) United States Patent
Staudinger et al.

(10) Patent No.: US 9,136,804 B2
(45) Date of Patent: Sep. 15, 2015

(54) SWITCH-MODE AMPLIFIER (71) Applicants: Joseph Staudinger, Gilbert, AZ (US); Paul Hart, Phoenix, AZ (US); Ramanujam Srinidhi Embar, Chandler, AZ (US); John Vaglica, Austin, TX (US)

(72) Inventors: Joseph Staudinger, Gilbert, AZ (US); Paul Hart, Phoenix, AZ (US); Ramanujam Srinidhi Embar, Chandler, AZ (US); John Vaglica, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 91 days.

(21) Appl. No.: 13/953,597

(22) Filed: Jul. 29, 2013

(65) Prior Publication Data
US 2015/0028948 A1   Jan. 29, 2015

(51) Int. Cl.
H03F 1/07   (2006.01)
H03F 3/217  (2006.01)

(52) U.S. Cl.
CPC .................................. *H03F 3/2171* (2013.01)

(58) Field of Classification Search
USPC ................. 330/124 R, 295, 84, 126
See application file for complete search history.

(56) References Cited

U.S. PATENT DOCUMENTS

| 5,757,229 | A  | * | 5/1998 | Mitzlaff | 330/124 R |
| 7,352,239 | B2 | * | 4/2008 | Lee et al. | 330/124 R |
| 8,736,347 | B2 | * | 5/2014 | Ahmed et al. | 327/355 |
| 2003/0073423 | A1 | | 4/2003 | Cho | |
| 2006/0119428 | A1 | | 6/2006 | Lee et al. | |
| 2007/0058603 | A1 | | 3/2007 | Song et al. | |
| 2010/0079210 | A1 | | 4/2010 | Yamauchi et al. | |
| 2011/0018628 | A1 | * | 1/2011 | Yang et al. | 330/124 R |
| 2013/0194023 | A1 | * | 8/2013 | Ahmed et al. | 327/360 |

FOREIGN PATENT DOCUMENTS

| EP | 0192876 A1 | 9/1986 |
| EP | 2538548 A1 | 12/2012 |
| EP | 2538557 A1 | 12/2012 |
| JP | 2006060301 A | 3/2006 |

OTHER PUBLICATIONS

Digital Doherty Amplifier With Enhanced Efficiency and Extended Range Ramzi Darraji, Student Member, IEEE, and Fadhel. M. Ghannouchi, Fellow, IEEE IEEE Transactions on Microwave Theory and Techniques, vol. 59, No. 11, Nov. 2011 pp. 2898-2909.

Smith, Karla Jenny Isabella Thesis: Gate Bias Control and Harmonic Laod Modulation for a Doherty Amplifier University of Canterbury. Electrical and Computer Engineering, Sep. 2, 2009.

Partial European Search Report dated Jan. 29, 2015, for Application No. EP14178036, 6 pages.

Extended European Search Report dated Jun. 26, 2015 for Application No. 14178036.1, 10 pages.

* cited by examiner

*Primary Examiner* — Henry Choe
(74) *Attorney, Agent, or Firm* — Quarles & Brady LLP (57) ABSTRACT

A device includes a Doherty amplifier. The Doherty amplifier has a carrier path and a peaking path. The Doherty amplifier includes a carrier amplifier configured to amplify a signal received from the carrier path and a peaking amplifier configured to amplify a signal received from the peaking path. The device includes a resistive switch having a first terminal connected to the peaking path and a second terminal connected to a voltage reference, and a controller configured to set the resistive switch to a first resistance value when a power input of the Doherty amplifier is below a threshold and to a second resistance value when the power input of the Doherty amplifier is above the threshold.

20 Claims, 5 Drawing Sheets

FIG. 8 ically a carrier path and a peaking path. The two paths are configured to operate at different classes. More particularly, the carrier amplification path typically operates in a class AB mode and the peaking amplification path is biased such that it operates in a class C mode. This enables improved power-added efficiency and linearity of the amplifier, as compared to a balanced amplifier, at the power levels commonly encountered in wireless communications applications.

SWITCH-MODE AMPLIFIER

FIELD OF THE INVENTION

Embodiments of the inventive subject matter relate to an amplifier having improved efficiency and more specifically to an amplifier having improved turn-on characteristics utilizing a variable resistance or switch to control an operation of the amplifier.

BACKGROUND OF THE INVENTION

Doherty amplifiers are amplifiers commonly used in wireless communication systems. Today, for example, Doherty amplifiers are used increasingly in base stations that enable the operation of wireless communications networks. Doherty amplifiers are suitable for use in such applications because the amplifiers include separate amplification paths—typically a carrier path and a peaking path. The two paths are configured to operate at different classes. More particularly, the carrier amplification path typically operates in a class AB mode and the peaking amplification path is biased such that it operates in a class C mode. This enables improved power-added efficiency and linearity of the amplifier, as compared to a balanced amplifier, at the power levels commonly encountered in wireless communications applications.

Generally, a power splitter supplies the input signals to each amplification path in the Doherty amplifier. Power splitters or signal splitters or dividers are known and used, as the name suggests, to divide or split a signal into two or more signals with known, predetermined power relationships.

In a Doherty amplifier, it is often desirable that the amplifier exhibit high efficiency. In a conventional Doherty amplifier, though, the manner in which the peaking amplifier begins conducting can reduce the overall efficiency of the amplifier.

BRIEF DESCRIPTION OF THE DRAWINGS

The accompanying figures, in which like reference numerals refer to identical or functionally similar elements throughout the separate views and which together with the detailed description below are incorporated in and form part of the specification, serve to further illustrate various embodiments and to explain various principles and advantages all in accordance with the present inventive subject matter.

DETAILED DESCRIPTION

In overview, the present disclosure describes embodiments of the inventive subject matter relating to an amplifier that may have improved efficiency and more specifically to an amplifier that may have improved turn-on characteristics utilizing a variable resistance or switch to control an operation of the amplifier.

In the present disclosure, embodiments of the system are described in conjunction with a Doherty amplifier, though it should be appreciated that in the present disclosure the Doherty amplifier may be replaced by an alternative dual-path or multiple-path amplifier, in other embodiments.

The instant disclosure is provided to further explain in an enabling fashion the best modes, at the time of the application, of making and using various embodiments in accordance with the present invention. The disclosure is further offered to enhance an understanding and appreciation for the inventive principles and advantages thereof, rather than to limit in any manner the scope of the invention.

It is further understood that the use of relational terms, if any, such as first and second, top and bottom, and the like are used solely to distinguish one entity or action from another without necessarily requiring or implying any actual such relationship or order between such entities or actions.

Much of the inventive functionality and many of the inventive principles are best implemented with or in integrated circuits (ICs) including possibly application specific ICs or ICs with integrated processing or control or other structures. It is expected that one of ordinary skill, notwithstanding possibly significant effort and many design choices motivated by, for example, available time, current technology, and economic considerations, when guided by the concepts and principles disclosed herein will be readily capable of generating such ICs and structures with minimal experimentation. Therefore, in the interest of brevity and minimization of any risk of obscuring the principles and concepts according to below-described embodiments of the present invention, further discussion of such structures and ICs, if any, will be limited to the essentials with respect to the principles and concepts of the various embodiments.

Doherty amplifiers are used in a number of wireless applications, as the amplifiers enable high efficiency over a wide output power range and can achieve a desired linearity using various linearization schemes. In many implementations, Doherty amplifiers include two amplifiers, a carrier or main amplifier, and a peaking amplifier. In a symmetric Doherty amplifier, the carrier and peaking amplifiers are the same size. Symmetric Doherty amplifiers are commonly used today, but asymmetric Doherty amplifiers that employ a peaking amplifier that is larger than the carrier amplifier offer the potential for additional efficiency improvements.

In a Doherty amplifier, an input signal is split at an input or power splitter between the main and peaking amplification path or circuit. The split signals are then separately amplified by the main and peaking amplifiers of the Doherty amplifier and combined at an output stage. When combining the outputs of the main and peaking amplifiers, it may be desired to make minor adjustments in the phase and amplitude or attenuation of the Doherty device's input splitter to provide optimal balancing between the outputs of each path. To facilitate this adjustment, a Doherty amplifier may include an adjustable power divider or splitter that can be used to fine-tune the configuration of the input signals to both the main and peaking amplifiers. A Doherty amplifier may also include an adjustable phase delay and/or an amplitude adjustment configured to selectively modify the phase shift and/or amplitude one of one or more paths of the Doherty amplifier.

Figure 1:
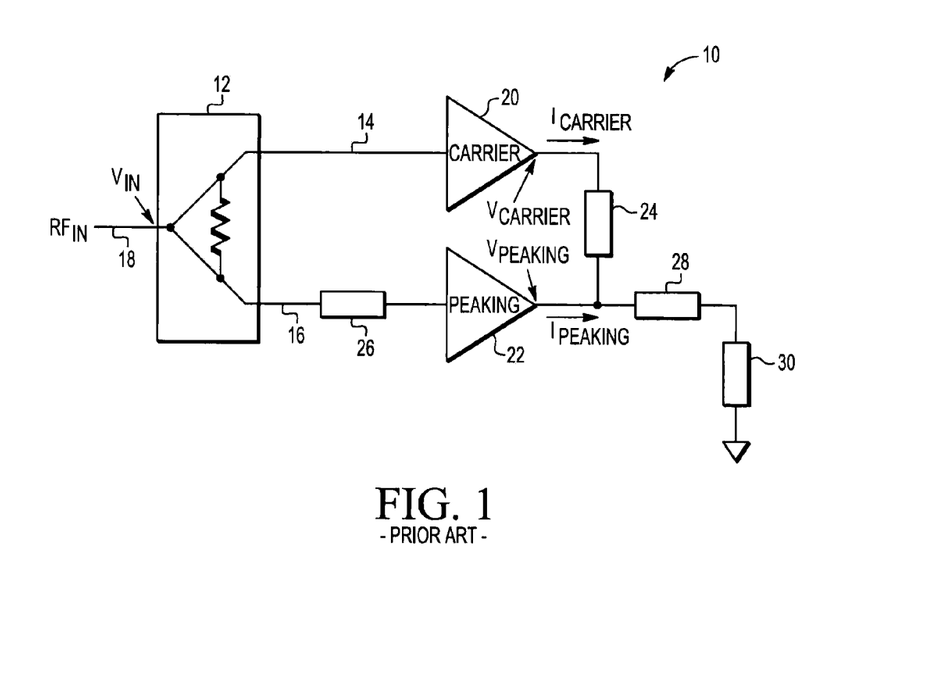
FIG. 1 shows a conventional Doherty amplifier lineup including a main or carrier path and a peaking path.

FIG. 1 shows a conventional Doherty amplifier lineup 10 including a main and a peaking path. In FIG. 1 as shown, a power splitter 12, such as an adjustable power splitter or radio frequency power splitter, is coupled to a main path 14 and a peaking path 16 of Doherty amplifier 10. The power splitter 12 is configured to divide an input signal 18 (e.g., radio frequency in (RFIN)) into multiple signals that are each transmitted along different amplification paths. Each amplification path may include a number of attenuators, phase shifters, and/or amplifiers. In FIG. 1, the power splitter 12 generates two output signals.

In one implementation, the power splitter 12 can include a power divider with an input for receiving an input radio frequency signal, and first and second divider outputs. When connected to a symmetrical Doherty amplifier, the power splitter 12 may divide or split an input signal received at the input 18 into two signals that are very similar with, in some embodiments, equal power. In other cases, though, the power splitter 12 may output signals having unequal power.

The outputs of the power splitter 12 are connected to main or carrier amplifier 20 and peaking amplifier 22. Carrier amplifier 20 is coupled via a matching network or circuit (not illustrated) to a first output of power splitter 12. Peaking amplifier 22 is coupled via a matching network or circuit (not illustrated) to a second output of power splitter 12. As will be appreciated by those of ordinary skill based on the description herein, the carrier and peaking amplifiers 20 and 22 may be comprised of one or more stages of relatively low power level amplification and relatively high power level amplification.

An impedance inverter or a λ/4 transmission line phase shift element 24 is connected between the output of carrier amplifier 20 and a summing node, and the output of the peaking amplifier 22 also is coupled to the summing node. The phase shift introduced by element 24 is, in some implementations, compensated by a 90 degree relative phase shift present on path 16 introduced by phase shift element 26.

An impedance network, including impedance 28, functions to present the proper load impedances to each of carrier amplifier 20 and peaking amplifier 22, and combines the signals produced from each amplifier at a common output node. An output load 30 (e.g., 50 ohms) is connected to the outputs of carrier amplifier 20 and peaking amplifier 22.

Amplifier 10 is configured so that the carrier amplifier 20 provides the amplification for lower level input signals, and both amplifiers 20 and 22 operate in combination to provide the amplification for high input level signals. In one implementation, the carrier amplifier 20 is configured to amplify a signal received from the main path 14, while the peaking amplifier 22 is configured to amplify a signal received from the peaking path 16 only when the signal received from the peaking path 16 exceeds a predetermined threshold.

This may be accomplished, for example, by biasing the carrier amplifier 20, such that the carrier amplifier 20 operates in a class AB mode, and biasing the peaking amplifier 22 such that the peaking amplifier 22 operates in a class C mode.

The Doherty amplifier 10 architecture depicted in FIG. 1 is widely used in communication systems due to the architecture's capability to deliver high efficiency over an extended input signal range. The architecture can also linearize well using Digital Pre-Distortion (DPD) techniques.

Figure 2A:
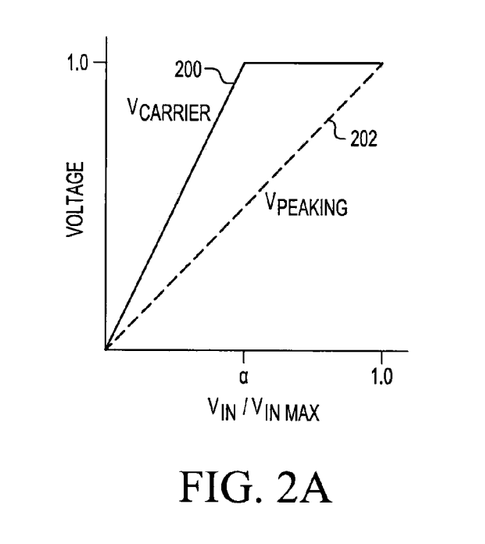
FIGS. 2A and 2B are graphs showing an idealized operation of a conventional Doherty amplifier wherein the carrier and peaking amplifiers are modeled as ideal voltage and current sources.
Figure 2B:
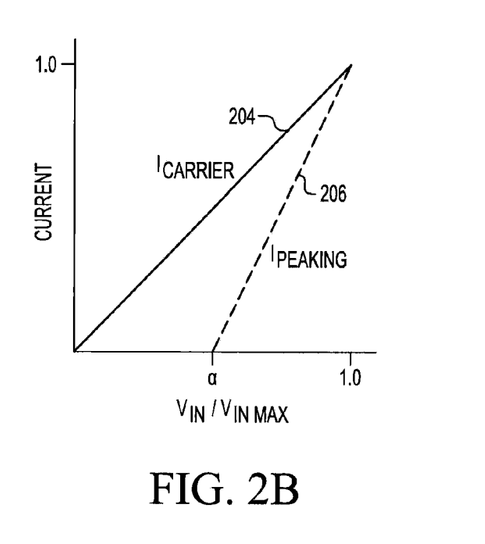

FIGS. 2A and 2B are graphs showing an idealized operation of a conventional. Doherty amplifier wherein the carrier and peaking amplifiers are modeled as ideal voltage and current sources. In FIG. 2A, the vertical axis represents voltages $V_{carrier}$ and $V_{peaking}$, at the output nodes of the carrier amplifier 20 and peaking amplifier 22 of FIG. 1, while the horizontal axis represents the normalized input voltage $V_{in}/V_{in\_max}$ (as identified in FIG. 1). $V_{in}$ is normalized to the maximum input voltage $V_{in\_max}$. In FIG. 2B, the vertical axis represents currents $I_{peaking}$ and $I_{carrier}$ (as identified in FIG. 1), while the horizontal axis represents the normalized input voltage $V_{in}/V_{in\_max}$. Currents $I_{carrier}$ and $I_{peaking}$ are the result of sweeping the input power from zero to higher values which result in $V_{in}/V_{in\_max}$ equal to unity. In both graphs, the voltage and current values have been normalized around the value of 1.0 volt (V) or amp (A), respectively. The curves depicted in FIGS. 2A and 2B represent all possible operating points for the idealized carrier and peaking amplifiers. In FIG. 2A, line 200 shows the voltage for the carrier amplifier, while line 202 shows voltage for the peaking amplifier. In FIG. 2B, line 204 shows the current for the carrier amplifier, while line 206 shows the current for the peaking amplifier.

The operation of the Doherty amplifier illustrated in FIGS. 2A and 2B is based on well known first order concepts where the carrier amplifier 20 and peaking amplifier 22 are modeled as current sources when not saturated, and voltage sources when saturated. At low input power levels, peaking amplifier 22 of amplifier 10 is non-conducting due to the Class-C bias of peaking amplifier 22. As such, all amplification generated by amplifier 10 is achieved using only carrier amplifier 20. With increasing input power levels, a point is reached (i.e., transition point α as labeled on both FIGS. 2A and 2B) where the radio frequency (RF) input signal is sufficiently large such that carrier amplifier 20 is at the onset of saturation and produces a consistent RF output voltage of 1 V (normalized)—see the horizontal portion of line 200 of FIG. 2A. When saturated, carrier amplifier 20 can be represented and modeled by first order principles as a voltage source such that with further increases in input power $V_{carrier}$ remains at unity (normalized). Due to impedance inverters 24 and 28 (shown on FIG. 1), voltage $V_{peaking}$ is less than unity. With further increases in input power, the operation of carrier amplifier 20 and peaking amplifier 22 moves beyond the point α. The carrier amplifier begins to conduct and contribute current $I_{peaking}$ having the effect of modulating the impedance seen by carrier amplifier 20, which then further allows carrier amplifier 20 to contribute additional RF current. Under full drive conditions where $V_{in}/V_{in\_max}$ equals unity, both carrier amplifier 20 and peaking amplifier 22 are saturated and producing maximum power.

The value of transition point α can be determined by the desired load modulation, which is related to the power capability of the carrier and peaking amplifiers. Typically, transition point α is chosen as 1/(1+Pp/Pc), where Pp and Pc are the power capability of the peaking and carrier amplifiers, respectively. This is illustrated by the increase in current from peaking amplifier 22 depicted in line 206 of FIG. 2B above the point α on the horizontal axis.

In evaluating the performance of a Doherty amplifier, consideration may be made for the amplifier's operation when input power levels are near—above and below—transition point α, and the overall efficiency of the Doherty amplifier in that region. A traditional analysis of the Doherty architecture in which the carrier and peaking amplifiers are represented by ideal voltage and current sources suggests that at transition point α the efficiency of the overall Doherty amplifier is determined solely by the carrier amplifier; assuming Class-B operation for the carrier amplifier, an efficiency value of π/4 is suggested at $V_{in}/V_{in\_max}=α$. This analysis assumes the peaking amplifier to be non-contributing since, in the idealized model, $I_{Peaking}$ is zero at transition point α.

In reality, the peaking amplifier is not an ideal voltage and current source. $I_{peaking}$ does not transition abruptly from zero to above zero as $V_{in}/V_{in\_max}$ transitions from below α to above α due to the Class-C operation of the peaking amplifier. In other words, the sharp corners in lines 200, 202, 204, and 206 at transition point α of FIGS. 2A and 2B do not accurately depict the operation of a real Doherty amplifier. In practice, the responses are more gradual for both $I_{Peaking}$ and $V_{Carrier}$.

Figure 3A:
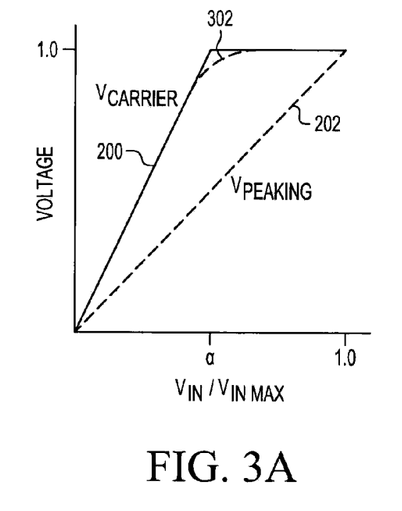
FIGS. 3A and 3B show the graphs of FIGS. 2A and 2B, respectively, modified to depict the actual operation of a Doherty amplifier.

FIGS. 3A and 3B show the graphs of FIGS. 2A and 2B, respectively, with modifications to depict the actual operation of a Doherty amplifier about transition point α. As seen in FIG. 3A, about transition point α the voltage of the carrier amplifier (depicted by line 202) does not sharply transition from increasing to reaching a maximum value of 1.0 V. Instead, as shown by dashed line 302, the transition is gradual. As such, in a real amplifier, even at some power output level greater than that of transition point α, the carrier amplifier has still not reached full saturation, again, in contradiction to the idealized model.

Figure 3B:
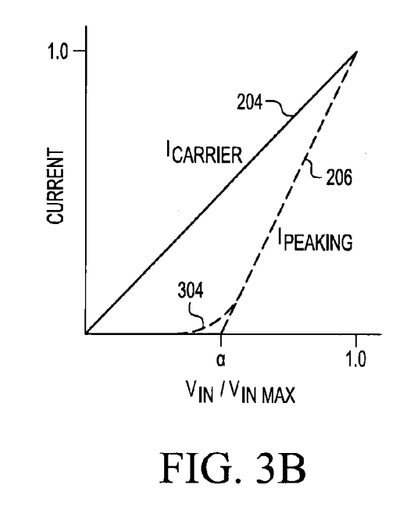

Similarly, as seen in FIG. 3B, the current of the peaking amplifier (depicted by line 206) does not sharply transition when the peaking amplifier begins conducting near transition point α. Instead, as shown by dashed line 304, the transition is gradual. As such, in a real amplifier, even at some power output less than that of transition point α, the peaking amplifier is already conducting, in contradiction to the idealized model.

These effects are deleterious on the overall Doherty efficiency about transition operating point α.

In the present system and method, the RF voltage at the input of the peaking amplifier is modulated using a variable resistance or resistive switch element. This modulation controls the operation of the peaking amplifier and improves overall efficiency of the Doherty amplifier. In various implementations, the resistive switch may include one or more transistors, for example, P-high-electron-mobility transistors (pHemts) that may be manufactured using gallium arsenide (GaAs), FETs (Field Effect Transistors) using silicon-on-insulator technologies, or other types of transistors. In one implementation, the resistive switch is a circuit element having two terminals having an adjustable resistance between the two terminals. A control input receives a signal configured to control the resistance between the two terminals. The input may be limited to two candidate values (e.g., a low and high voltage), in which case the two input values cause the adjustable resistance to be equal to one of two candidate values. Alternatively, the input may be analog, wherein a magnitude of the input signal determines the resistance of the resistive switch. Similarly, the input may be a digital value where a digital input signal is translated by the resistive switch into a particular resistance value. The resistive switch may be configured so that when transitioning from one resistance value to another, rather than change resistance abruptly, the switch changes resistance gradually (e.g., through a number of intermediary resistance states) over a period of time. Alternatively, the resistive switch's resistance may be a function of an input voltage to the switch. In that case, as described below with respect to FIG. 5, when the input voltage is below a first threshold value, the resistance of the switch may be set to a first value. Similarly, when the input voltage is above a second threshold, the resistance of the switch may be set to a second value. When the input signal falls between the first and second threshold values, the resistance of the switch may be a function of the input voltage. In one implementation, the function is a linear function.

Figure 4:
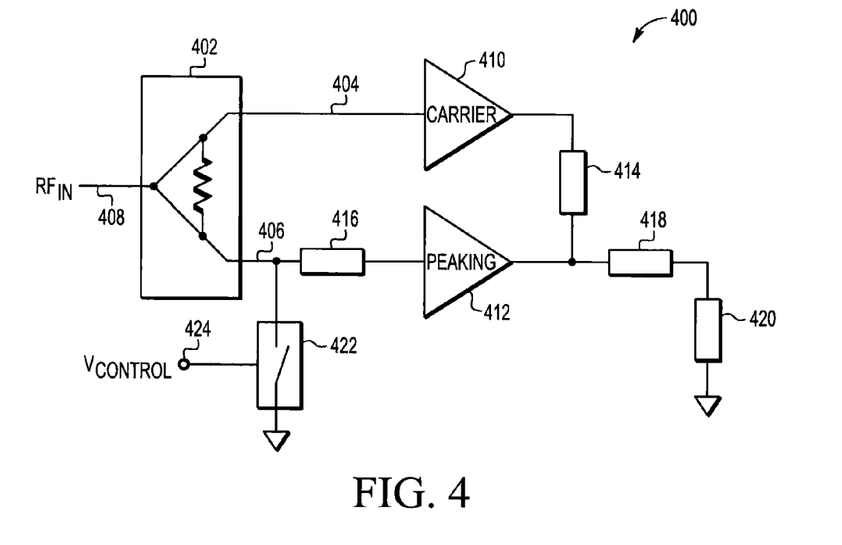
FIG. 4 shows a Doherty amplifier lineup including a main and a peaking path and a resistive switch or variable resistance connected to the peaking path.

As illustrated, FIG. 4 shows a Doherty amplifier lineup 400 including a main and a peaking path and a resistive switch connected to the peaking path. In FIG. 4, power splitter 402 is coupled to a main path 404 and a peaking path 406 of Doherty amplifier 400. The power splitter 402 is configured to divide an input signal 408 (RFIN) into multiple signals that are each transmitted along different amplification paths. Each amplification path may include a number of attenuators, phase shifters, and/or amplifiers.

The outputs of power splitter 402 are connected to main or carrier amplifier 410 and peaking amplifier 412. Carrier amplifier 410 is coupled via a matching network or circuit (not illustrated) to a first output of power splitter 402. Peaking amplifier 412 is coupled via a matching network or circuit (not illustrated) to a second output of power splitter 402.

An impedance inverter or a λ/4 line phase shift element 414 is connected between the output of carrier amplifier 410 and a summing node, and the output of peaking amplifier 412 also is connected to the summing node. The phase shift introduced by element 414 is, in some implementations, compensated by a 90 degree relative phase shift present on path 406 introduced by phase shift element 416. In an alternate embodiment, device 400 may have an "inverted Doherty" configuration. In such a configuration, the impedance inverter or λ/4 line phase shift element 414 is connected between the output of peaking amplifier 412 and the summing node, rather than being connected between the output of carrier amplifier 410 and the summing node. In addition, in an inverted Doherty implementation, the phase shift introduced by element 414 can be compensated by a 90 degree relative phase shift present on path 404, rather than on path 406. An impedance network, including impedances 418 and 420, functions to present the proper load impedances to each of carrier amplifier 410 and peaking amplifier 412, and outputs the combined signals produced from each amplifier at a common output node.

Resistive switch 422 is connected to peaking path 406 in a shunt configuration. A first current carrying terminal of switch 422 is connected to peaking path 406 between an output of power splitter 402 and an input of peaking amplifier 412. Switch 422 includes a control input 424 for receiving a signal $V_{control}$. A second current carrying terminal of switch 422 is connected to a voltage reference (e.g., Vdd or ground), for example through a ground voltage node. Control input 424 may be utilized by a suitably-configured controller (not shown), such as a programmed microprocessor or other controller, to set switch 422 to a desired resistance level between the current carrying terminals.

In one implementation, switch 422 may be binary and only accept two inputs as $V_{control}$. In that case, a first input value or voltage at input 424 would put switch 422 into a low resistance or conductive state (i.e., a relatively low resistance between the current carrying terminals) and a second input value or voltage would put switch 422 into a high resistance or non-conductive state (i.e., a relatively high resistance between the current carrying terminals). Alternatively, the input $V_{control}$ at input 424 of switch 422 may be analog. In that case, the resistance of switch 422 may be set in response to $V_{control}$ being set to a particular analog voltage value. The analog voltage value may then be mapped by switch 422 to a particular resistance value. In still other implementations, switch 422 may be configurable to a number of different resistances, where the $V_{control}$ at input 424 of switch 422 may be a binary value to select a particular one of those different resistances.

In one implementation, for input signal levels of $V_{in}/V_{in\_max}$ less than α, switch 422 is set to a low resistance in order to prevent the Class-C biased peaking amplifier 412 turning on and conducting current. Specifically, the RF voltage present at the input to the peaking amplifier is reduced, thereby keeping the peaking amplifier in a non-conducting state. The equivalent resistance of the resistive switch in this state need not be close to zero ohms, and in fact, a value greater than zero ohms may be utilized so as to limit RF voltage standing wave ratio (VSWR) mismatch effects due to the switching action. Hence, the resistive switch is operated as a resistive element, switching between two resistance values or states where the lower resistance value may be in the 10's of ohms (e.g., between about 5 ohms and about 50 ohms or more), and the high resistance value may be several orders of magnitude larger (e.g., between about 1000 ohms to about 5000 ohms or more). This allows carrier amplifier 410 to approach its saturation voltage (e.g. as shown in FIGS. 3A and 3B) without interference from peaking amplifier 412, resulting in higher Doherty efficiency at transition point α. Conversely, as the input signal levels grow greater than α, at which point carrier amplifier 410 is saturated, switch 422 is set to a relatively high resistance, allowing peaking amplifier 412 to begin operating.

Generally, when transitioning from a low resistance to a high resistance, switch 422 makes the transition over a relatively small transition range. The voltage transition range may be between about 1% and 10% of $V_{in\_max}$. As the resistance of switch 422 increases, peaking amplifier 412 observes an increasing magnitude of the input signal at the input of peaking amplifier 412 and begins conducting. The transition of resistance of switch 422 from low to high over a relatively small transition voltage results in a smooth, but relatively abrupt turn-on of peaking amplifier 412, thereby preserving a smooth gain response of the overall Doherty amplifier 400. If, however, switch 422 were to change from low resistance to high resistance instantaneously or near-instantaneously, such a change in resistance could introduce transient signals into the signal path of the Doherty amplifier.

By keeping the resistance of switch 422 low at input levels below transition point α, the input signal to peaking amplifier 412 is kept small as much of the signal passes through switch 412 due to the low resistance of switch 412. Therefore, the input signal amplitude is kept small enough to prevent peaking amplifier 412 from conducting before carrier amplifier 410 has reached saturation. At full drive conditions and when the input levels exceed the transition point α, switch 422 is at a high resistance, and normal Doherty operation is achieved. In one implementation, the low resistance value of switch 422 is greater than about 10 ohms and may be between about 10 and about 20 ohms. In an alternate embodiment, the low resistance value of switch 422 may be in a range of about 20 ohms to about 100 ohms or more. The high resistance value is greater than 1,000 ohms and, in some cases, as high a resistance value as the amplifier design allows (e.g., up to about 5,000 ohms or more).

In the present embodiment, it is desirable that the low resistance value of switch 422 not be equal to, or approximately equal to, about 0 ohms. If the low resistance of switch 422 were to approximate a short circuit, when changing state (either from low to high resistance or high to low resistance), the switch may create an undesirable transient glitch into the amplifier's complex gain response and degrade amplifier linearity. That transient may be observed in the amplifier's gain, amplitude-modulation/phase-modulation, linearity, etc. Linearity performance and amplifier linearizability (using DPD for example) is important for cellular infrastructure transmitter applications. Accordingly, the in the present system, switch 422, when in its low resistance state, exhibits a resistance of at least 10 ohms for a 50 ohm system.

Figure 5:
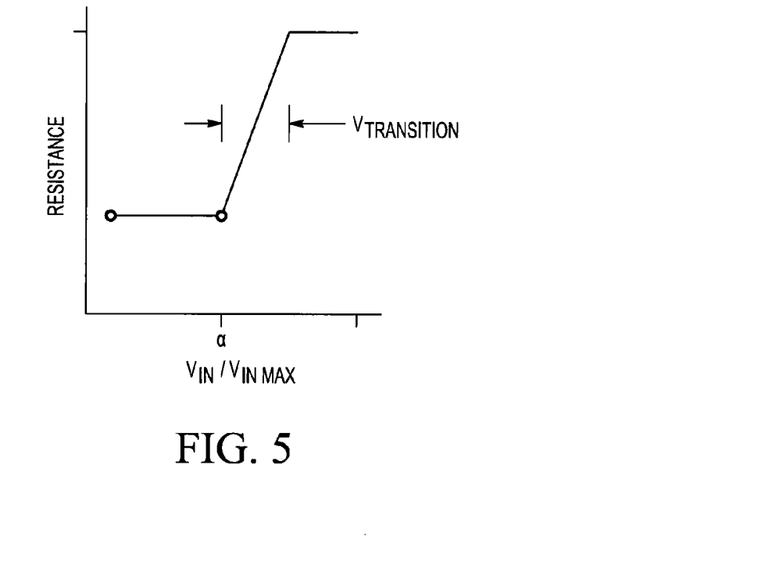
FIG. 5 is a graph depicting a resistance of a switch versus $V_{in}/V_{in\_max}$.

In some embodiments, switch 422 exhibits a resistance that is a function of $V_{in}/V_{in\_max}$. FIG. 5 is a graph depicting a resistance of switch 422 versus $V_{in}/V_{in\_max}$. As shown in FIG. 5, the response of switch 422 is piece-wise-linear, although other functions can be used as well. At levels of $V_{in}/V_{in\_max}$ below transition point α, the resistance of switch 422 is set to a low value. As the value of $V_{in}/V_{in\_max}$ transitions above transition point α, the resistance of switch 422 increases linearly over a transition range that is denoted $V_{transition}$. At the end of the transition range, switch 422 is set to a high (e.g., maximum) resistance. In various other implementations, the resistance of switch 422, rather than being determined by the value of $V_{in}/V_{in\_max}$ may instead be a function of the amplitude of an envelope of an input signal to the Doherty amplifier. For example, when the envelope amplitude is relatively low, switch 422 may be set to a first resistance state (e.g., a low resistance state), and when the envelope amplitude is relatively high, switch 422 may be set to a second resistance state (e.g., a high resistance state).

An alternative implementation of Doherty amplifier 400 calls for switch 422 to be connected in series between power splitter 402 and peaking amplifier 412, rather than in the shunt configuration depicted in FIG. 4. When connected in series, switch 422 would exhibit the opposite resistance characteristics than those described above where switch 422 is in a shunt configuration. Accordingly, when in series, for levels of $V_{in}/V_{in\_max}$ below transition point α, the resistance of the switch would be set to a high value, and decrease linearly over a transition range. At the end of the transition range, the resistance of the switch would be set to a low (e.g., minimum) resistance value. In the series configuration, though, in contrast to the shunt configuration described above, the low resistance state may be at or near zero ohms (e.g., between about 0 ohms and about 5 ohms), while the high resistance state must be limited to a maximum higher value (e.g., between about 100 ohms and about 300 ohms or more), such as approximately 200 ohms to prevent VSWR mismatch effects leading to discontinuities in amplifier gain and or phase, for example.

By incorporating switch 422 into the Doherty amplifier 400 and controlling the variable resistance of switch 422 according to the methods described above, the performance of Doherty amplifier 400 can be made to more closely approximate that of an ideal amplifier in comparison to conventional devices.

Figure 6A:
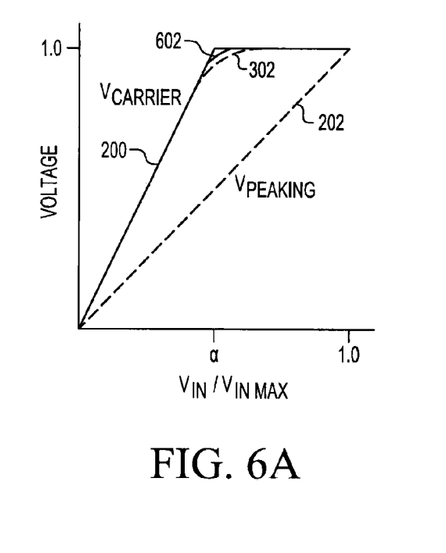
FIGS. 6A and 6B are graphs depicting the operation of an idealized Doherty amplifier, a conventional Doherty amplifier, and the Doherty amplifier depicted in FIG. 4.
Figure 6B:
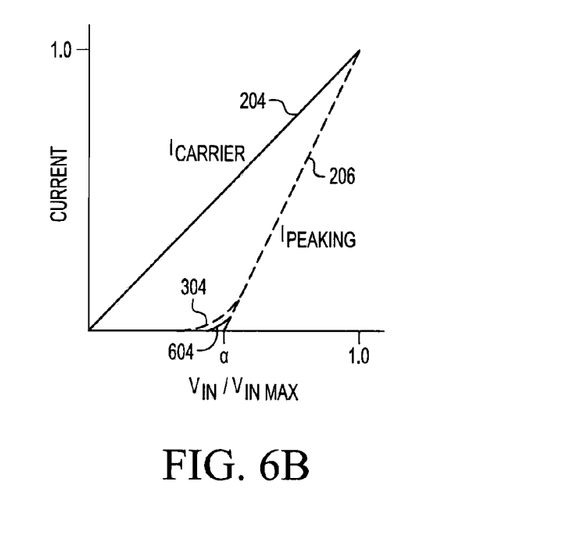

As such, FIGS. 6A and 6B are graphs depicting the operation of an idealized Doherty amplifier, a conventional Doherty amplifier, and the Doherty amplifier depicted in FIG. 4. Each graph shows data for the carrier amplifier and peaking amplifier of the Doherty amplifier. In FIG. 6A, line 200 shows the voltage for the carrier amplifier, while line 202 shows voltage for the peaking amplifier. In FIG. 6B, line 204 shows the current for the carrier amplifier, while line 206 shows the current for the peaking amplifier. In both graphs, the voltage and current values have been normalized around the value of 1.0. As in FIGS. 3A and 3B, dashed lines 302 and 304 represent the actual voltage and current curves of a conventional Doherty amplifier about transition point α. Curves 602 and 604 represent the voltage and current curves about transition point α of a Doherty amplifier configured in accordance with FIG. 4.

As seen in FIG. 6A, in the device incorporating switch 422, the carrier amplifier reaches saturation voltage at a reduced output beyond transition point α as compared to a conventional device (see line 602). Similarly, with regards to FIG. 6B, in the device incorporating switch 422 the peaking amplifier begins conducting at a greater input power level as compared to a conventional device (see line 604). These two attributes of the Doherty amplifier 400 may realize a more ideal and more efficient Doherty power amplifier by enhancing the effective turn-on characteristics of the peaking amplifier.

Figure 7:
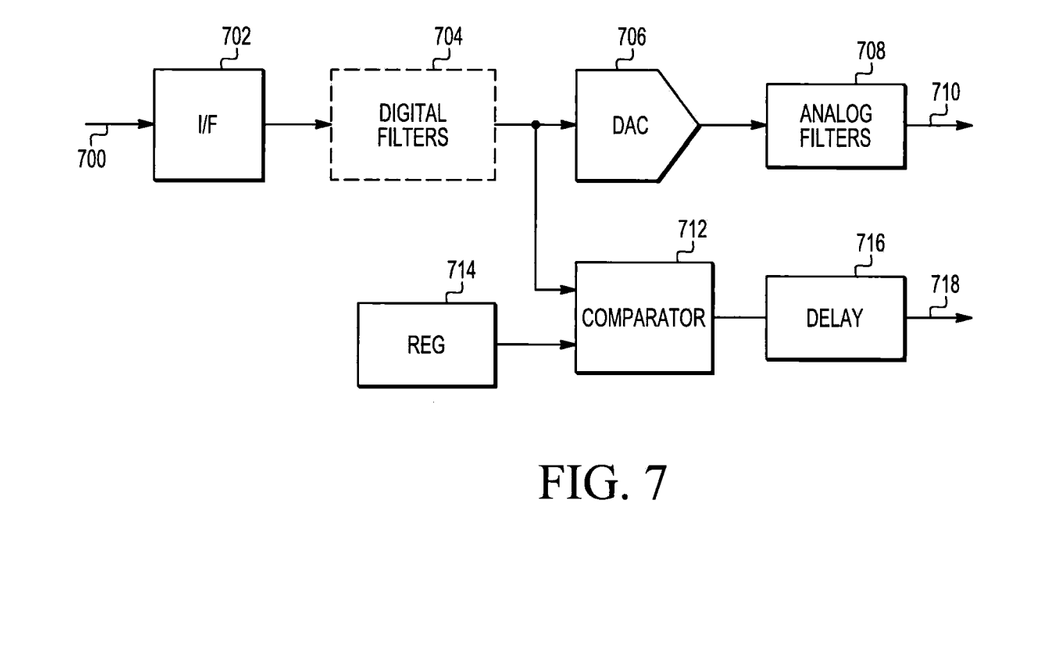
FIG. 7 is a block diagram illustrating the functional components of a controller for the switch of the Doherty amplifier depicted in FIG. 4.

FIG. 7 is a block diagram illustrating the functional components of a controller for switch 422 of Doherty amplifier 400 depicted in FIG. 4. In this implementation, switch 422 has two states—a low resistance state and a high resistance state. The states are controlled by an input $V_{control}$ that can have either a high value or a low value. When $V_{control}$ is set to the high value, switch 422 transitions into a high resistance state. When $V_{control}$ is set to the low value, switch 422 transitions into a low resistance state. In other implementations, though, switch 422 may exhibit different behavior in response to the input $V_{control}$, wherein a high value of $V_{control}$ causes the resistance of switch 422 to go low and vice versa.

At input 700 the controller receives a digital input signal for transmission by a Doherty amplifier (e.g., Doherty amplifier 400 of FIG. 4). In one implementation, the input signal may be received in the form of a JESD204 or a low-voltage differential signaling (LVDS) signal. The signal received at input 700 is then processed by interface (I/F) block 702. I/F blocks 702 converts the JESD or LVDS interface protocol and signal levels to those appropriate for the internal logic of the controller. For example, in the case of JESD, I/F block 702 converts the differential signaling levels at the device pins to the internal logic levels, synchronizes to the serial bit stream, and converts the serial bit stream to parallel data words that would be passed to digital filters 704. Digital filters 704 would typically interpolate the data words to a higher data rate as required by the digital to analog converter (DAC) 706. Digital filters 704 could also compensate for any non-linearities in the DAC or subsequent circuitry. In some cases, the digital filters 704 are optional. When included in the controller, the digital filters 704 may be configured using a serial peripheral interface (SPI). Once filtered, the filtered signal is passed to DAC 706, where the signal is converted into an analog signal. The analog signal can then be filtered by one or more analog filters 708 and outputted, at node 710, for transmission to the Doherty amplifier. The signal will then be amplified by the Doherty amplifier's carrier amplifier only or by both the carrier and peaking amplifiers and applied to an antenna for transmission.

Comparator 712 is configured to receive the digital signal during processing. As shown in FIG. 7, comparator 712 receives the digital signal after the digital signal is filtered by the optional digital filters 704, though comparator 712 may receive the digital input signal at any point of processing. The value of the digital signal is then compared to a threshold value stored in register 714. Register 714 may be any memory component configured to store a value in an electronic memory that may be either dynamic or static. If the value of the digital signal is sufficiently low that the peaking amplifier should not be conducting (i.e., a value less than transition point α) the output of the controller is such that switch 422 is set to a resistance value that causes the peaking amplifier to not conduct. Conversely, if the value of the digital signal is sufficiently high that the peaking amplifier should be conducting (i.e., a value greater than or equal to transition point α) the output of the controller is such that switch 422 is set to a resistance value that causes the peaking amplifier to conduct.

In one implementation, the output of digital filters 704, forming one of the inputs to comparator 712, is the baseband signal to be transmitted represented in digital form. In that case, register 714 stores a value describing a baseband signal level at or above which the peaking amplifier should conduct. The baseband signal value is then compared to the value stored in register 714 by comparator 712. Comparator 712 then determines whether the output 718 should be set to a high or low value based upon the comparison. When the baseband signal level exceeds that at which the peaking amplifier should be turned on (e.g., the value is greater than or equal to the value stored in register 714), the output 718 is set to a value that causes the peaking amplifier to conduct. However, when the baseband signal level does not exceed that at which the peaking amplifier should be turned on (e.g., the value is less than the value stored in register 714), the output 718 is set to a value that causes the peaking amplifier to not conduct. The threshold value in register 714 may also be set, for example, using an SPI. Generally, the clock of comparator 712 is synchronous with the clock of DAC 706 to ensure that the comparisons performed by comparator 712 are synchronous with the data flowing to the power amplifier through DAC 706.

Depending upon whether the digital input signal exceeds the threshold value stored in register 714, the output of comparator 712 will be either high or low. The output of comparator 712 may be delayed by delay element 716, which outputs the delayed signal at output 718. The signal at output 718 is then supplied to an input of switch 422, for example, to control a state of the switch 422. If the output 718 is high, then the switch 422 will enter its high resistance state. If, however, the output 718 is low, then the switch 422 will enter its low resistance state. Alternatively, switch 422 and the operation of the comparator 712 can both be reversed to achieve the same property.

In an alternate implementation, comparator 712 may output a multi-bit value that represents a range of resistance values for switch 422. The comparator output would then be relative to a programmable range around the desired switch point through which switch 422 can transition from a low to high impedance state, or vice-versa. By breaking the switch's resistive transition into multiple smaller steps, finer control of the peaking amplifier turn-on can be possible. In yet another implementation, the multi-bit comparator output is automatically sequenced thru a predefined or programmable sequence of steps from starting to ending resistance values at a predefined rate.

The delay implemented by delay 716 should be carefully selected to compensate for a number of potential delays that may occur within the Doherty amplifier and connected components. For example, within the Doherty amplifier a number of filters and pre-drivers may introduce propagation delays. The delay provided by delay 716 should introduce similar delays on the signal outputted by comparator 712. This provides that the operation of switch 422 is time aligned with that of the remainder of Doherty amplifier 400. Delay 716 may also be used to compensate for propagation through the digital processing chain if the comparator 712 is inserted earlier in the processing chain, for instance in front of digital filters 714. In that case, delay 716 could include the sum total of the delay through the digital filter 704, DAC 706, analog filters 708 and the Doherty amplifier path up to switch 422.

Embodiments of the present system and method, therefore, may provide a more ideal and more efficient Doherty power amplifier by enhancing the effective turn-on characteristics of the peaking amplifier of the Doherty amplifier. For signal levels below a transition voltage, a switch attenuates the RF signal at the input of the peaking amplifier thereby maintaining the peaking amplifier in an off-state. For input signal levels above the transition voltage, the switch resistance is changed (e.g., increased for the shunt embodiment or decreased for the series embodiment) allowing the peaking amplifier to turn-on quickly.

Figure 8:
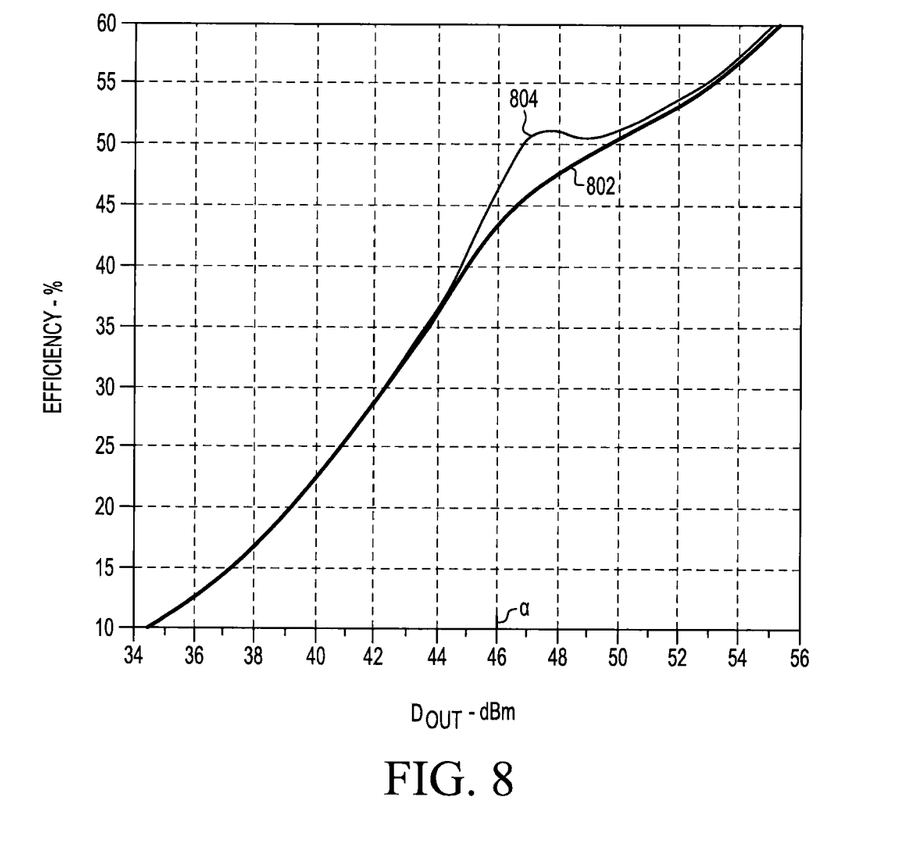
FIG. 8 is a graph depicting efficiency for a conventional Doherty amplifier and the present Doherty amplifier versus power output of the amplifiers.

In simulation, a Doherty amplifier configured in accordance with the present disclosure has demonstrated improved efficiency. FIG. 8 is a graph depicting efficiency for a conventional Doherty amplifier and an embodiment of the present Doherty amplifier device versus power output of the amplifiers in decibels. Line 802 depicts the efficiency of the conventional device, while line 804 depicts the efficiency of an embodiment of the present Doherty amplifier device. As seen in FIG. 8, about transition point α, an embodiment of the present Doherty amplifier device (line 804) demonstrates improved efficiency as compared to the conventional device.

In some implementations, Doherty amplifiers may be implemented that include more than two amplifiers (e.g., beyond a carrier amplifier and peaking amplifier). These amplifiers are referred to as N-way Doherty amplifiers and can include three or more amplifiers. For example, a 3-way Doherty would consist of one carrier amplifier and two peaking amplifier circuits. In such an embodiment, a resistive switch element may be placed on the input side of each peaking amplifier, and each switch element may be controlled by separate and independent control signals. In similar fashion to the two-amplifier Doherty lineup shown in FIG. 4, in an N-way Doherty amplifier, each of the N amplifiers may be configured to begin conducting at different input power levels. In that case, one or more of the amplifiers contained within an N-way Doherty amplifier may include a switch (e.g., switch 422 of FIG. 4) to control the operation of the amplifier, as described herein.

In such an implementation, the resistance switches coupled to one or more of the amplifiers in the N-way Doherty amplifier may be configured in a shunt arrangement or in series with the amplifiers, also as described herein. The various switches may be each be similarly configured, with similar low and high resistance characteristics, or may have different resistance characteristics. Each of the switches can have an input (e.g., $V_{control}$) to control whether the switch is put into its low or high resistance state.

The control signal for each switch may be supplied by one or more controllers configured to compare an input signal to the amplifier to a threshold value to determine whether the associated amplifier should be operative. If so, the relevant switch is placed into a resistance state enabling the amplifier to operate. If not, the relevant switch is placed into a resistance state to disable operation of the amplifier.

An embodiment of a device includes a Doherty amplifier having a carrier path and a peaking path. The Doherty amplifier includes a carrier amplifier configured to amplify a signal received from the carrier path and a peaking amplifier configured to amplify a signal received from the peaking path. The device includes a resistive switch having a first terminal connected to the peaking path and a second terminal connected to a voltage reference, and a controller configured to set the resistive switch to a first resistance value when a power input of the Doherty amplifier is below a threshold and to a second resistance value when the power input of the Doherty amplifier is above the threshold.

An embodiment of a device includes an amplifier having a first path and a second path. The first path has a first amplifier and the second path having a second amplifier. The device includes a resistive switch having a first terminal connected to the second path, and a controller configured to set the resistive switch to a first state when a power input of the amplifier is below a threshold and to a second state when the power input of the amplifier is above the threshold.

An embodiment of a controller includes an input configured to receive a digital input signal. The digital input signal is configured for transmission by a multiple-path amplifier. The multiple-path amplifier includes a resistive switch configured to receive a control signal to set a resistance of the resistive switch to first or second resistance states. The resistive switch inhibits operation of an amplifier in the multiple-path amplifier when in the first resistance state and allows operation of the amplifier in the multiple-path amplifier when in the second resistance state. The controller includes a register configured to store a threshold, and a comparator configured to compare the digital input signal to the threshold, when the digital input signal is less than the threshold, generate a first output signal configured to cause the resistive switch to have the first resistance value, and, when the digital input signal is greater than the threshold, generate a second output signal configured to cause the resistive switch to have the second resistance value.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A device, comprising:
    a Doherty amplifier having a carrier path and a peaking path, the Doherty amplifier including a carrier amplifier configured to amplify a signal received from the carrier path and a peaking amplifier configured to amplify a signal received from the peaking path;
    a resistive switch having a first terminal connected to the peaking path and a second terminal connected to a voltage reference; and
    a controller configured to set the resistive switch to a first resistance value when a power input of the Doherty amplifier is below a threshold and to a second resistance value when the power input of the Doherty amplifier is above the threshold and wherein the first terminal of the resistive switch is connected to an input terminal of the peaking amplifier and the second terminal of the resistive switch is directly connected to the reference voltage.

2. The device of claim 1, wherein the resistive switch includes one or more transistors.

3. The device of claim 2, wherein the resistive switch includes a high-electron-mobility transistor.

4. The device of claim 1, wherein the first resistance value is less than the second resistance value.

5. The device of claim 1, wherein the controller is configured to increase the resistance of the resistive switch over a range of power inputs from the first resistance value to the second resistance value.

6. The device of claim 5, wherein the first resistance value is greater than 10 ohms.

7. The device of claim 6, wherein the second resistance value is greater than 1,000 ohms.

8. The device of claim 1, wherein the power input is determined by analyzing an envelope of a digital input signal to the device.

9. A device, comprising:
an amplifier having a first path and a second path, the first path having a first amplifier and the second path having a second amplifier;
a resistive switch having a first terminal connected to the second path and a second terminal connected to a reference voltage; and
a controller configured to set the resistive switch to a first state when a power input of the amplifier is below a threshold and to a second state when the power input of the amplifier is above the threshold and wherein the first terminal of the resistive switch is connected to an input terminal of the second path and the second terminal of the resistive switch is directly connected to a ground voltage.

10. The device of claim 9, wherein the resistive switch includes a high-electron-mobility transistor.

11. The device of claim 9, wherein the first state causes the resistive switch to have a first resistance value and the second state causes the resistive switch to have a second resistance value.

12. The device of claim 11, wherein the resistive switch is connected to the second path in a shunt configuration.

13. The device of claim 12, wherein the first resistance value is greater than 10 ohms.

14. The device of claim 12, wherein the second resistance value is greater than 1,000 ohms.

15. The device of claim 11, wherein the resistive switch is connected in series with an input to the second amplifier.

16. The device of claim 15, wherein the first resistance value is between zero ohms and 5 ohms.

17. A controller, comprising:
an input configured to receive a digital input signal, the digital input signal being configured for transmission by a multiple-path amplifier, the multiple-path amplifier including a resistive switch configured to receive a control signal to set a resistance of the resistive switch to first or second resistance states, the resistive switch inhibiting operation of an amplifier in the multiple-path amplifier when in the first resistance state and allowing operation of the amplifier in the multiple-path amplifier when in the second resistance state;
a register configured to store a threshold;
a comparator configured to:
compare the digital input signal to the threshold,
when the digital input signal is less than the threshold, generate a first output signal configured to cause the resistive switch to have the first resistance value, and
when the digital input signal is greater than the threshold, generate a second output signal configured to cause the resistive switch to have the second resistance value wherein a first terminal of the resistive switch is connected to an input terminal of the second path in multipe path amplifier and a second terminal of the resistive switch is directly connected to a reference voltage.

18. The controller of claim 17, wherein the controller includes a digital filter configured to filter the digital input signal into a baseband signal.

19. The controller of claim 17, wherein the threshold in the register is configured to be modified using a serial peripheral interface.

20. The controller of claim 17, including a delay stage configured to delay the first and second output signal by a time period based upon a delay of at least one component of the multiple-path amplifier.

* * * * *